US006271666B1

(12) United States Patent
Linz et al.

(10) Patent No.: US 6,271,666 B1
(45) Date of Patent: Aug. 7, 2001

(54) FILTERING OF OSCILLATORY B0 BEHAVIOR IN NMR DEVICES

(75) Inventors: Anton M. Linz, Mukwonago; Kevin F. King, New Berlin, both of WI (US)

(73) Assignee: General Electric Company, Schnectady, NY (US)

( * ) Notice: Subject to any disclaimer, the term of this patent is extended or adjusted under 35 U.S.C. 154(b) by 0 days.

(21) Appl. No.: 09/316,801

(22) Filed: May 21, 1999

(51) Int. Cl.$^7$ .......................................... G01V 3/00

(52) U.S. Cl. ........................................ 324/314; 324/309

(58) Field of Search ............................ 324/309, 307, 324/306, 312, 314, 300

(56) References Cited

U.S. PATENT DOCUMENTS

| 5,289,127 | * | 2/1994 | Doddrell et al. | 324/314 |
| 5,864,233 | * | 1/1999 | Zhou et al. | 324/309 |
| 5,914,601 |   | 6/1999 | Goldfarb | 324/322 |
| 5,923,168 | * | 7/1999 | Zhou et al. | 324/309 |

FOREIGN PATENT DOCUMENTS

| 196 16 403 | 11/1997 | (DE) . |
| 0 538 668 A1 | 4/1993 | (EP) . |

OTHER PUBLICATIONS

S. Crozier et al., Correction for the Effect of Induced $B_0$ Shifts in Localized Spectroscopy and Imaging by Direct Frequency Modulation, Journal of Magnetic Resonance, Series B, vol. 103, 1994, pp. 115–119.

U. Klose, In Vivo Proton Spectroscopy in Presence of Eddy Currents, Magnetic Resonance in Medicine, vol. 14, 1990, pp. 26–30.

Effect of Oscillatory Eddy Currents on MR Spectroscopy; L.N. Ryner, P. Stromen, T. Wessel, D.I. Hoult, J.K. Saunders; Proc. $6^{th}$ ISMRM, p. 1903, 1998.

Correction of Eddy–Current–Induced B0 Shifts by Receiver Reference–Phase Modulation; Stuart Crozier, Craig D. Eccles, Frank A. Beckey, James Field, and David M. Doddrell; Journal of Magnetic Resonance 97, pp. 661–665; 1992.

Analytical Method for the Compensation of Eddy–Current Effects Induced by Pulsed Magnetic Field Gradients in NMR Systems; P. Jehenson, M. Westphal, and N. Schuff; Journal of Magnetic Resonance, pp. 264–278 90; 1990.

* cited by examiner

Primary Examiner—Louis Arana
(74) Attorney, Agent, or Firm—Armstrong Teasdale LLP; Christina G. Cabou

(57) ABSTRACT

The present invention, in one form, provides compensation for the effects of an oscillatory B0 eddy current $B_e(t)$ in an NMR apparatus. In an NMR apparatus having a transmitter generating a spin excitation signal and a receiver detecting an NMR signal, applied gradient signals are analyzed to estimate a resulting oscillatory B0 eddy current $B_e(t)$. The frequency of either the transmitter or the receiver of the NMR apparatus, or both, is shifted in frequency by an amount proportional to $B_e(t)$ to achieve compensation. The applied gradient signals are digitized and filtered using a recursive filter that is based upon an oscillatory model of the oscillatory B0 eddy current $B_e(t)$

18 Claims, 3 Drawing Sheets

FILTERING OF OSCILLATORY B0 BEHAVIOR IN NMR DEVICES

BACKGROUND OF THE INVENTION

This invention relates generally to methods and apparatus for correction of distortion of signals in a nuclear magnetic resonance (NMR) system, and more particularly to methods and apparatus for correction of distortion in such NMR systems caused by switching of gradient magnetic fields when such switching results in oscillatory B0 magnetic fields.

In at least one known NMR imaging device, nuclear spins are subjected to magnetic fields and excited by a spin excitation signal from a radio frequency transmitter. The magnetic field is uniform and homogeneous. The frequency of the spin excitation signal is such that a resonant matching occurs to a natural Larmor precession frequency for those magnetic spins to be excited. The excited nuclear spins precess about a direction of the homogeneous magnetic field vector at an angle that depends upon the strength and duration of the spin excitation field. If the homogeneous magnetic field varies with time, the precession frequency will also vary.

In addition, at least one known NMR and imaging device utilizes gradient magnetic fields for volume selective spectroscopy or imaging. Gradient magnetic fields are applied to encode volume regions of a sample and thereby allow for position sensitive measurements of the nuclear magnetic resonance signal. However, when the gradient magnetic fields are switched on and off, inductive coupling produces current flow in conductive elements of the device. These currents produce undesirable time-dependent magnetic fields that adversely affect signal measurement. An undesirable eddy current field component, i.e., a uniform B0 component, is one result of necessary gradient field changes. Uncompensated B0 eddy currents can lead to image quality problems such as ghosting or to degraded MR (magnetic resonance) spectroscopy performance.

In known systems, only exponentially decaying gradient and B0 eddy current errors have been recognized. However, the introduction of shielded magnets with shortened axial extent has resulted in drastically higher static magnetic fields near the edges of the gradient coil. These magnetic fields, in turn, produce higher forces and significant oscillatory eddy currents. Oscillatory B0 eddy currents cause unwanted side lobes in MR spectroscopy and artifacts in MR imaging.

It would be desirable to provide apparatus and methods for correcting for oscillatory B0 eddy currents in the presence of changes in the gradient field.

BRIEF DESCRIPTION OF THE INVENTION

In one exemplary embodiment of the present invention, an NMR apparatus having a transmitter generating a spin excitation signal and a receiver detecting an NMR signal analyzes gradient signals to estimate a resulting oscillatory B0 eddy current $B_e(t)$. A frequency of either the transmitter or the receiver of the NMR apparatus, or both, is shifted in frequency by an amount proportional to $B_e(t)$ to compensate for the oscillatory B0 eddy current. The applied gradient signals are digitized and filtered using a recursive filter derived from an oscillatory model of the eddy current $B_e(t)$. The recursive filter has a complex-valued output, and the eddy current $B_e(t)$ estimate is the real part of the complex-valued output of the recursive filter.

The above described embodiment and others that are described herein effectively compensate for oscillatory B0 eddy currents to provide enhanced NMR image quality and MR spectroscopy performance.

DETAILED DESCRIPTION OF THE INVENTION

Figure 1:
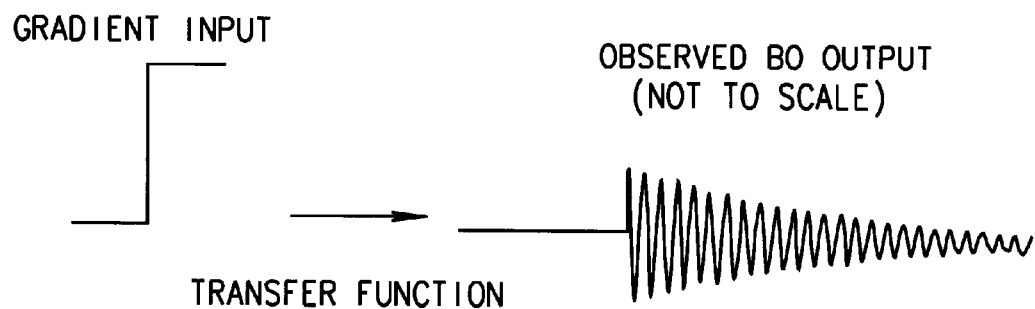
FIG. 1 is a graph illustrating an observed B0 behavior in response to an application of a gradient magnetic field.

The present invention, in one embodiment, is a filter that is utilized in an NMR system (not shown) to provide real-time compensation of B0 error for arbitrary gradient inputs. In this embodiment, the NMR system includes a radio frequency transmitter (not shown) that excites nuclear spins subjected to a uniform and homogeneous magnetic field with a radio frequency electromagnetic wave of a selected frequency that resonantly matches the natural Larmor precession frequency of those magnetic spins to be excited. The NMR system also includes a receiver to detect signals resulting from the excited spins. The NMR system also includes one or more coils that provide gradient magnetic fields that are selectively generated by current flowing through the coils. The filter analyzes the currents flowing through these coils to generate an estimate of an oscillatory B0 eddy current, which is, in turn, used to adjust a frequency of the transmitter and/or the receiver. This adjustment compensates for the B0 error, as shown in FIG. 1, which results from rapidly switching on a gradient, that would otherwise be present in the NMR system.

The following derivation results in an efficient filter for providing a correction for oscillatory B0 eddy currents $B_e(t)$. The modeled eddy currents are written as:

$$B_e(t) = -\frac{dG(t)}{dt} * h(t) \qquad (1)$$

where G(t) is a gradient signal displayed on any of the three axes x, y, or z, and where * denotes convolution, and where the impulse response h(t) is written as:

$$h(t) = u(t)\sum_{k=0}^{N-1} \alpha_k e^{-t/\tau_k} \cos(2\pi f_k t + \theta_k) \qquad (2)$$

with u(t) equal to the unit step function written as:

$$u(t) = \begin{cases} 0, & t < 0 \\ 1, & t \geq 0. \end{cases} \qquad (3)$$

Figure 5:
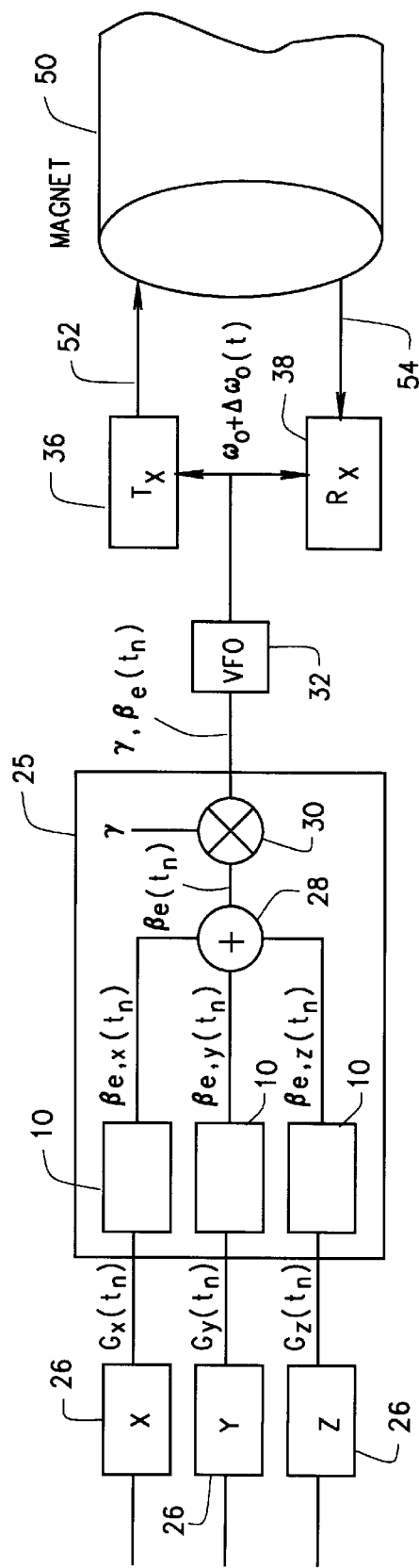
FIG. 5 is a block diagram of an embodiment of a three-channel recursive filter for estimating a correction frequency in accordance with the invention.

The receive frequency is shifted by an amount $\gamma B_e(t)$, where $\gamma$ is the gyromagnetic ratio. To perform the shift in real time with a digital transceiver 36, 38 as shown in FIG. 5, determination of $B_e(t)$ in eq. (1) is made as efficient as possible. As a result of the receive frequency shifted at discrete intervals $\Delta t$, if $\Delta t \gg (1/f)_{smallest}$ and $\Delta t \gg \tau_{smallest}$, where $(1/f)_{smallest}$ and $\tau_{smallest}$ each represent the smallest values of $1/f_k$ and $\tau_k$, respectively, for all k, then eq. (1) is evaluated with sufficient accuracy using the z-transform.

In one embodiment, it will suffice to consider the case N=1. Generalizations for larger N follow by superposition. In this embodiment, the real part of the function $u(t)\alpha e^{-\beta t j \theta}$ is h(t), where $\beta = 1/\tau - j2\pi f$. $B_e(t)$ is the real part of a complex quantity $Y(t) = -(dG(t)/dt)*((u(t)\alpha e^{-\beta t}e^{j\theta})$.

The unit step response for $Y_{step}(t)$ is determined by setting $G(t) = u(t)$ so that:

$$Y_{step}(t) - \alpha e^{-\beta t + j\theta}u(t) \tag{4}$$

If t is sampled at intervals of $\Delta t$, the z-trans form of equation (4) is written as:

$$\tilde{Y}_{step}(z) = -\alpha e^{j\theta}\left(\frac{z}{z - e^{-\beta \Delta t}}\right). \tag{5}$$

Dividing the step response $\tilde{Y}_{step}(z)$ by the z-transform of the unit step $\tilde{u}(z) = z/(z-1)$ produces the z-transform of the transfer function $\tilde{h}(z)$:

$$\tilde{h}(z) = -\alpha e^{j\theta}\left(\frac{z-1}{z - e^{-\beta \Delta t}}\right) \tag{6}$$

The general response for any gradient signal $\tilde{G}(z)$ is then determined by:

$$\tilde{Y}(z) = -\tilde{G}(z)\alpha e^{-j\theta}\left(\frac{z-1}{z - e^{-\beta \Delta t}}\right). \tag{7}$$

Determining an inverse z-transform of eq. (7) generates Y at discrete times $t_n = n\Delta t$ in accordance with:

$$Y(t_n) = e^{-\beta \Delta t}Y(t_{n-1}) - \alpha e^{j\theta}\Delta G(t_n), \tag{8}$$

where $\Delta G(t_n) = G(t_n) - G(t_{n-1})$ with $B_e(t_n) = \text{Re}[Y(t_n)]$.

Eq. (8) provides the mathematical basis for a recursive digital filter, i.e., an infinite impulse response or IIR filter, for determining $B_e(t_n)$. The number of operations required for this filter is much smaller than for evaluating eq. (1) by direct convolution. To use this filter for compensation of oscillatory B0 eddy currents, it is necessary to estimate filter parameters $f_k$, $\tau_k$, $\alpha_k$, and $\theta^k$ for each k from 0 to N-1, where N is a number selected or determined to provide an adequate number of terms to sufficiently approximate the observed oscillatory behavior. In one embodiment, a value N=1 was determined to adequately correct for oscillatory B0 behavior.

Figure 2:
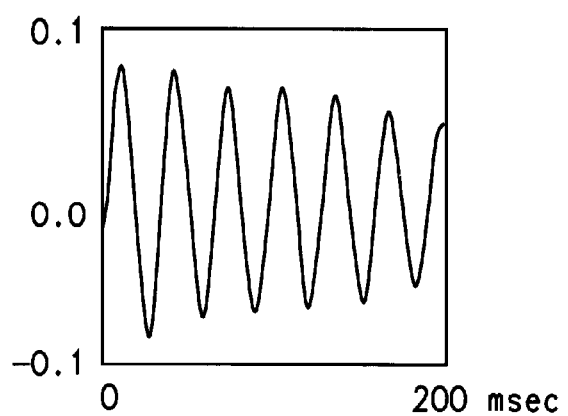
FIG. 2 is a graph showing a measured oscillatory B0 eddy current in a NMR system.

In one embodiment, to determine the characteristics of the filter for a specific imaging system, the imaging system is adjusted to optimize the compensation for non-oscillatory eddy currents. B0 eddy currents are then measured using a known driving signal, and a fitting routine is utilized to obtain estimates for the for the parameters of h(t) in eq. (2). In one example using a known NMR imaging system, B0 eddy currents were measured by using a sinusoidal driving signal over a range of frequencies. A quasi-resonance was observed at around 32 Hz. FIG. 2 shows the measured B0 eddy current in the known NMR imaging system resulting from twenty complete cycles of a 31.25 Hz sinusoidal exciting signal with amplitude 2 Gauss/cm (G/cm) on the x-axis. The vertical axis of the plot is normalized by the maximum amplitude of the exciting gradient.

Estimates for the parameters of h(t) in eq. (2) were determined for this system, with a simplex fitting routine using the assumption N=1. The estimates obtained were f=31.91 Hz, $\tau$0.36 sec., $\alpha$=0.000036 cm, and $\theta$=0.16 radians. Eq. (8) for this system can therefore be evaluated in sufficient time to allow an update time of $\Delta t$=64 $\mu$sec. Since $\Delta t$ clearly satisfies $\Delta t \gg 1/f$ and $\Delta t \gg \tau$ for the data of FIG. 2, the z-transform analysis and eq. (8) are good approximations.

Figure 3:
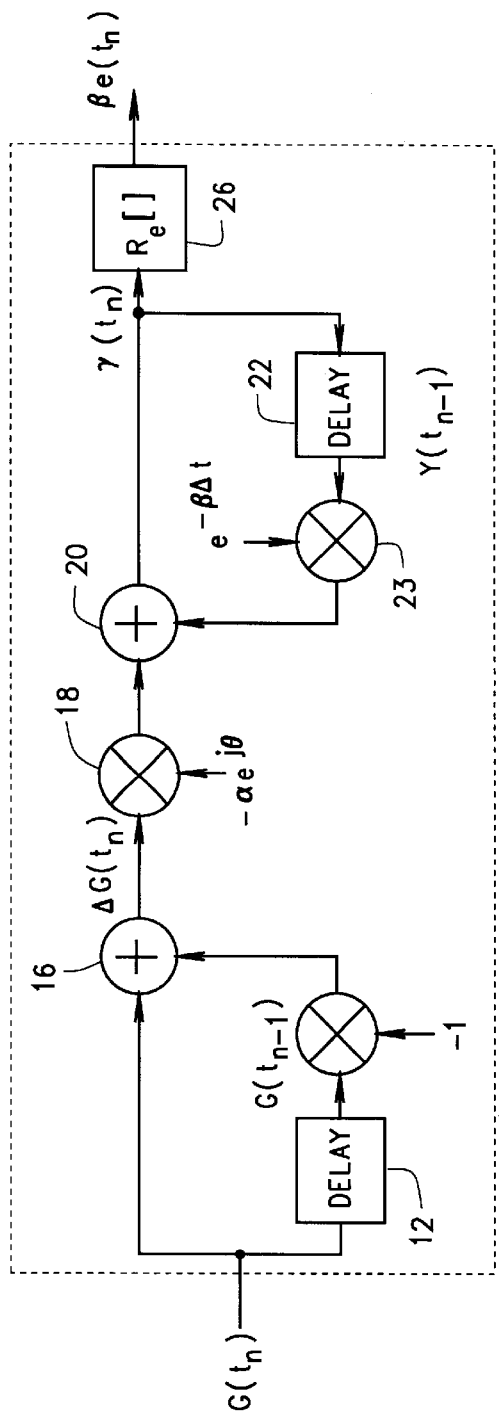
FIG. 3 is a block diagram of an embodiment of a single channel recursive filter for estimating a correction frequency in accordance with the invention.

For eddy currents with sufficient long period and decay constant compared to the filter update interval, the frequency shift can be determined using a recursive filter to minimize computation time with a digital transceiver. In one embodiment and as shown in FIG. 3, a digital recursive filter 10 estimates $B_e(t_n)$ from an applied gradient $G(t_n)$. The signal $G(t_n)$ is a digitized representation of a gradient current applied to a magnetic coil (not shown), the representation being produced by an analog-to-digital converter (also not shown). Initially, the digitized $G(t_n)$ is applied to a delay 12. The delayed signal $G(t_{n-1})$ is then supplied to multiplier 14, where it is multiplied, for example, by −1. The result of the multiplication is supplied to adder 16 where it is added to $G(t_n)$ to generate $\Delta G(t_n)$. The result of this addition is supplied to multiplier 18, where it is multiplied by a quantity $-\alpha e^{j\theta}$, parameters $\alpha$ and $\theta$ having been estimated in advance. A resulting signal is added by adder 20 to a signal that is a function of an output $Y(t_n)$ of adder 20 delayed by delay 22 and multiplied by $e^{-\beta \Delta t}$ at multiplier 23, where $\beta$ is determined in advance by estimation, and $\Delta t$ is a discrete sampling time. Function 24 takes the real part of $Y(t_n)$ to produce output $B_e(t_n)$ It will be recognized by those skilled in the art that filter 10 in FIG. 3 can readily be implemented in special purpose hardware or as software or firmware that is executed by a processor (not shown) in an NMR system. It will also be recognized by those skilled in the art that various modifications of filter 10 are possible, including modification that operate directly on $G(t_n)$ without generating an intermediate result $\Delta G(t_n)$.

Figure 4:
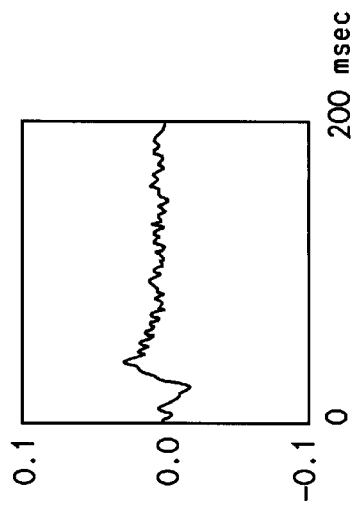
FIG. 4 is a graph showing measured B0 eddy currents in the same NMR system from which FIG. 2 was obtained, but in which frequency shift compensation in accordance with the invention was applied.

A digital recursive filter having the parameters fitted to the oscillatory B0 eddy current shown in FIG. 2 was implemented. This filter was used to shift the imaging system receive frequency of the known NMR system while a B0 eddy current was excited using the same driving signal as for FIG. 2. As shown by the results illustrated in FIG. 4, oscillatory B0 eddy currents were effectively corrected by shifting the receive frequency by an amount predicted from the exciting gradient signals and eddy current impulse response.

In one embodiment and as shown in FIG. 5, a correction circuit 25 is employed to compensate for oscillatory B0 eddy currents resulting from a set of gradient signals $G_x(t)$, $G_y(t)$, $G_z(t)$. The $G_x(t)$, $G_y(t)$, $G_z(t)$ signals, in one embodiment, are signals such as those generated by a set of $G_x$, $G_y$, and $G_z$ pulse control modules, or amplifiers 26 in one known NMR system. All signals represented in FIG. 5 are digitized. In this embodiment, each of a set of samples $G_x(t_n)$, $G_y(t_n)$, $G_z(t_n)$ of gradient signals $G_x(t)$, $G_y(t)$, $G_z(t)$ is input to a filter 10 of a type as shown in FIG. 3. Although illustrated as identical filters, in one embodiment, each filter 10 employs different internal parameters $\alpha$, $\beta$, and $\theta$ if necessary. In one embodiment, appropriate parameters are obtained for each filter 10 from observed B0 eddy currents resulting from separate tests in which each gradient coil is separately excited. A simplex fitting routine is used to determine the parameters of h(t) in eq. (4), as described above. This technique provides estimates of parameters $\alpha$, $\beta$, and $\theta$ in each filter 10 so that outputs $B_{e,x}(t_n)$, $B_{e,y}(t_n)$, $B_{e,z}(t_n)$ are added by adder 28 to produce an output $B_e(t_n)$ representing a composite effect of signals $G_x(t)$, $G_y(t)$, $G_z(t)$ on a uniform, homogeneous magnetic field. Output $B_e(t_n)$ is applied to a multiplier 30, where it is multiplied by $\gamma$ to obtain an instantaneous frequency correction $\gamma B_e(t_n)$ This correction may be applied to a variable frequency oscillator (VFOs) 32 that is coupled to NMR RF transmitter 36 and receiver 38. The correction provides a frequency control for transmitter 36 and receiver 38. An excitation signal 52 is applied to excite a substance exposed to a magnetic field generated by a magnet 50, and a received signal 54 is processed by a receiver 38.

It will be recognized that some or all of the digital filtering and processing of signals in FIG. 5 including that performed by correction circuit 25 may be performed by special purpose signal processing hardware. However, such processing may also be performed by a processor executing software or firmware instructions. Furthermore, the frequency correction signals of this invention may be applied to frequency synthesized VFOs, including those employing direct digital synthesis.

From the preceding description of various embodiments of the present invention, it is evident that the invention provides efficient correction for oscillatory B0 eddy currents in NMR applications. Although the invention has been described and illustrated in detail, it is to be clearly understood that the same is intended by way of illustration and example only and is not to be taken by way of limitation. Accordingly the spirit and scope of the invention are to be limited only by the terms of the appended claims and their equivalents.

What is claimed is:

1. A method for compensating for the effects of an oscillatory B0 eddy current in an NMR apparatus, the NMR apparatus comprising a transmitter generating a spin excitation signal and a receiver detecting an NMR signal, said method comprising the steps of:

estimating an oscillatory B0 eddy current, $B_e(t)$, by analyzing at least one applied gradient signal; and shifting a frequency of at least one of the receiver and the transmitter by an amount proportional to $B_e(t)$.

2. A method in accordance with claim 1 wherein shifting a frequency of at least one of the receiver and the transmitter comprises the step of shifting both a transmitter and receiver frequency by an amount proportional to $B_e(t)$.

3. A method in accordance with claim 1 wherein the at least one applied gradient signal is G(t), and wherein estimating an oscillatory B0 eddy current comprises the steps of:

filtering the G(t) signal utilizing a recursive filter having a complex-valued output; and estimating $B_e(t)$ as a function of a real part of the complex-valued output.

4. A method in accordance with claim 3 wherein filtering the G(t) signal comprises the steps of:

generating a time-sampled representation $G(t_n)$ of G(t); and filtering the time-sampled representation $G(t_n)$ utilizing a recursive filter having a complex-valued output, the filter written as:

$$Y(t_n) = e^{-\beta \Delta \tau} Y(t_{n-1}) - \alpha e^{j\theta} \Delta G(t_n),$$

where:

$\Delta G(t_n) = G(t_n) - G(t_{n-1})$, and $\alpha$, $\beta$, and $\theta$ are constants; and wherein estimating $B_e(t)$ as a function of a real part of the complex-valued output comprises the step of estimating an instantaneous value $B_e(t_n)$ as a real part of the complex-valued $Y(t_n)$.

5. A method in accordance with claim 4 wherein $\beta = 1/\tau - j2\pi f$, and further comprising the steps of:

measuring a B0 eddy current $B_{e,test}(t)$ as a function of an applied test signal; and estimating values of $\alpha$, $\beta$, and $\theta$ to fit $B_{e,test}(t)$ in accordance with an equation $$h(t) = u(t) \sum_{k=1}^{N} a_k e^{-t/\tau_k} \cos(2\pi f_k t + \theta_k),$$

where:

N=1;

u(t) is a unit step function given by:

$$u(t) = \begin{cases} 0, & t < 0 \\ 1, & t \geq 0, \end{cases}$$

and $B_{e,test}(t)$ written as:

$$B_{e,test}(t) = -\frac{dG(t)}{dt} * h(t).$$

6. A method in accordance with claim 1 wherein the at least one applied gradient signal comprises three gradient signals $G_x(t)$, $G_y(t)$, $G_z(t)$, and estimating the oscillatory B0 eddy current comprises the steps of:

filtering signals representative of $G_x(t)$, $G_y(t)$, $G_z(t)$ utilizing recursive filters, each having a complex-valued output; and estimating $B_e(t)$ as a function of a sum of a real part of the complex-valued outputs of the recursive filters.

7. A method in accordance with claim 6 wherein filtering signals representative of $G_x(t)$, $G_y(t)$, $G_z(t)$ utilizing recursive filters comprises the steps of:

determining time-sampled representations $G_x(t_n)$, $G_y(t_n)$, $G_z(t_n)$ of $G_x(t)$, G (t), $G_z(t)$; and filtering the time-sampled representations $G_x(t_n)$, $G_y(t_n)$, $G_z(t_n)$ utilizing recursive filters each having a complex-valued output, each recursive filter written as:

$$Y(t_n) = e^{-\beta \Delta \tau} Y(t_{n-1}) - \alpha e^{j\theta} \Delta G(t_n),$$

where:

G(t) is one of $G_x(t_n)$, $G_y(t_n)$, $G_z(t_n)$;

$\Delta G(t_n) = G(t_n) - G(t_{n-1})$, and $\alpha$, $\beta$, and $\theta$ are constants; and wherein estimating $B_e(t)$ as a function of a sum of a real part of the complex-valued outputs of the recursive filters comprises the step of estimating an instantaneous value $B_e(t_n)$ as a function of a sum of a real part of the complex-valued outputs of the recursive filters.

8. A method in accordance with claim 7 wherein $\beta = 1/\tau - j2\pi f$, and further comprising the steps of:

measuring a B0 eddy current $B_{e,test}(t)$ as a function of an applied test signal; and estimating values of $\alpha$, $\beta$, and $\theta$ to fit $B_{e,test}(t)$ in accordance with an equation $$h(t) = u(t)\sum_{k=1}^{N} a_k e^{-t/\tau_k} \cos(2\pi f_k t + \theta_k),$$

where:

N 1;

u(t) is a unit step function given by:

$$u(t) = \begin{cases} 0, & t < 0 \\ 1, & t \geq 0, \end{cases}$$

and $B_{e,test}(t)$ is written as:

$$B_{e,test}(t) = -\frac{dG(t)}{dt} * h(t).$$

9. A method in accordance with claim 8 wherein values of α, β, and θ are different for each of the recursive filters, and wherein said steps of measuring a B0 eddy current $B_{e,test}(t)$ as a function of an applied test signal and fitting values of α, β, and θ to $B_{e,test}(t)$ in accordance with an equation $$h(t) = u(t)\sum_{k=1}^{N} a_k e^{-t/\tau_k} \cos(2\pi f_k t + \theta_k),$$

are performed a plurality of times to obtain estimates of α, β, and θ for each of the recursive filters.

10. A correction system for compensating for the effects of an oscillatory B0 eddy current in an NMR apparatus, the NMR apparatus including a transmitter generating a spin excitation signal and a receiver detecting an NMR signal, said correction system configured to:

estimate an oscillatory B0 eddy current, $B_e(t)$, by analyzing at least one applied gradient signal; and shift a frequency of at least one of the receiver and the transmitter by an amount proportional to $B_e(t)$.

11. A correction system in accordance with claim 10 further configured to shift both the transmitter and the receiver frequency by an amount proportional to $B_e(t)$.

12. A correction system in accordance with claim 10 further comprising a recursive filter having a complex valued output, and wherein the at least one applied gradient signal is G(t), wherein said system is further configured to:

filter the G(t) signal utilizing said recursive filter; and estimate $B_e(t)$ as a function of a real part of said complex-valued output.

13. A correction system in accordance with claim 12 further configured to:

generate a time-sampled representation $G(t_n)$ of G(t); and filter said time-sampled representation $G(t_n)$ utilizing said recursive filter, said recursive filter written as:

$$Y(t_n) = e^{-\beta \Delta \tau} Y(t_{n-1}) - \alpha e^{j\theta} \Delta G(t_n),$$

where:

$\Delta G(t_n) = G(t_n) - G(t_{n-1})$, and α, β, and θ are constants;

said system further configured to estimate $B_e(t)$ as an instantaneous value $B_e(t_n)$, said instantaneous value obtained as a real part of the complex-valued $Y(t_n)$.

14. A correction system in accordance with claim 13 wherein $\beta = 1/\tau - j2\pi f$, and wherein said system is further configured to:

measure a B0 eddy current $B_{e,test}(t)$ as a function of an applied test signal; and estimate values of α, β, and θ to fit $B_{e,test}(t)$ in accordance with an equation $$h(t) = u(t)\sum_{k=1}^{N} a_k e^{-t/\tau_k} \cos(2\pi f_k t + \theta_k),$$

where:

N=1;

u(t) is a unit step function given by:

$$u(t) = \begin{cases} 0, & t < 0 \\ 1, & t \geq 0, \end{cases}$$

and said $B_{e,test}(t)$ is written as:

$$B_{e,test}(t) = -\frac{dG(t)}{dt} * h(t).$$

15. A correction system in accordance with claim 10 comprising at least three recursive filters, wherein the at least one applied gradient signal comprises three gradient signals $G_x(t)$, $G_y(t)$, $G_z(t)$, wherein said system is further configured to:

filter signals representative of $G_x(t)$, $G_y(t)$, $G_z(t)$ utilizing said three recursive filters, each having a complex-valued output; and estimate $B_e(t)$ as a function of a sum of a real part of said complex-valued outputs of said three recursive filters.

16. A correction system in accordance with claim 15 further configured to:

determine time-sampled representations $G_x(t_n)$, $G_y(t_n)$, $G_z(t_n)$ of said $G_x(t)$, $G_y(t)$, $G_z(t)$; and filter said time-sampled representations $G_x(t_n)$, $G_y(t_n)$, $G_z(t_n)$ utilizing said recursive filters, wherein each said recursive filter is written as:

$$Y(t_n) = e^{-\beta \Delta \tau} Y(t_{n-1}) - \alpha e^{j\theta} \Delta G(t_n),$$

where:

G(t) is one of $G_x(t_n)$, $G_y(t_n)$, $G_z(t_n)$;

$\Delta G(t_n) = G(t_n) - G(t_{n-1})$, and α, β, and θ are constants; said system further configured to estimate an instantaneous value $B_e(t_n)$ as a function of a sum of a real part of said complex-valued outputs of said recursive filters.

17. A correction system in accordance with claim 16 wherein $\beta = 1/\tau - j2\pi f$, said system further configured to:

measure a B0 eddy current $B_{e,test}(t)$ as a function of an applied test signal; and estimate values of α, β, and θ to fit said $B_{e,test}(t)$ in accordance with an equation $$h(t) = u(t)\sum_{k=1}^{N} a_k e^{-t/\tau_k} \cos(2\pi f_k t + \theta_k),$$

where:

N=1;

u(t) is a unit step function given by:

$$u(t) = \begin{cases} 0, & t < 0 \\ 1, & t \geq 0, \end{cases}$$

and said $B_{e,test}(t)$ is written as:

$$B_{e,test}(t) = -\frac{dG(t)}{dt} * h(t).$$

18. A correction system in accordance with claim 17 wherein said values of $\alpha$, $\beta$, and $\theta$ are different for each said recursive filter, said system further configured to fit said different values of $\alpha$, $\beta$, and $\theta$ to $B_{e,test}(t)$ in accordance with an equation $$h(t) = u(t) \sum_{k=1}^{N} a_k e^{-t/\tau_k} \cos(2\pi f_k t + \theta_k),$$

for each said recursive filter.

* * * * *

UNITED STATES PATENT AND TRADEMARK OFFICE
CERTIFICATE OF CORRECTION

PATENT NO. : 6,271,666 B1
DATED : August 7, 2001
INVENTOR(S) : Linz et al.

It is certified that error appears in the above-identified patent and that said Letters Patent is hereby corrected as shown below:

Column 3,
Line 3, delete "$\Delta t \gg (1/f)_{smallest}$" and insert therefor -- $\Delta t \ll (1/f)_{smallest}$ --.
Line 3, delete "$\Delta t \gg \tau_{smallest}$" and insert therefor -- $\Delta t \ll \tau_{smallest}$ --.
Line 9, delete "$u(t)\alpha e^{-\beta t j\theta}$" and insert therefor -- $u(t)\alpha e^{-\beta t}e^{j\theta}$ --.
Line 3, equation (4), line 15, delete "$Y_{step}(t)- \alpha e^{-\beta t+j\theta}u(t)$" and insert therefor -- $Y_{step}(t) = -\alpha e^{-\beta t+j\theta}u(t)$ --.
Line 17, delete "z-trans form" and insert therefor -- z-transform --.
Line 24, delete "z|(z-1)" and insert therefor -- z/(z-1) --.
Line 49, delete "$\theta^k$" and insert therefor -- $\theta_k$ --.

Column 4,
Line 6, delete "$\tau 0.36$ sec." and insert therefor -- $\tau = 0.36$ sec. --.
Line 9, delete "$\Delta t \gg 1/f$" and insert therefor -- $\Delta t \ll 1/f$ --.
Line 9, delete "$\Delta t \gg \tau$" and insert therefor -- $\Delta t \ll \tau$ --.

Column 6,
Line 45, delete "G (t)" and insert therefor -- $G_y(t)$ --.

Column 7,
Line 7, delete "N 1" and insert therefor -- N = 1 --.

Column 8,
Line 3, delete "$B_{etest}(t)$" and insert therefor -- $B_{e,test}(t)$ --.

Signed and Sealed this

Seventh Day of October, 2003

JAMES E. ROGAN
*Director of the United States Patent and Trademark Office*